United States Patent
Duanmu et al.

(10) Patent No.: US 10,177,055 B2
(45) Date of Patent: Jan. 8, 2019

(54) PACKAGING STRUCTURE OF INTEGRATED SENSOR

(71) Applicant: Goertek.Inc, Shandong (CN)

(72) Inventors: Luyu Duanmu, Shandong (CN); Junde Zhang, Shandong (CN); Qinglin Song, Shandong (CN)

(73) Assignee: Goertek Inc., Weifang-Shandong (CN)

( * ) Notice: Subject to any disclaimer, the term of this patent is extended or adjusted under 35 U.S.C. 154(b) by 0 days.

(21) Appl. No.: 15/559,780

(22) PCT Filed: Dec. 10, 2015

(86) PCT No.: PCT/CN2015/096911
§ 371 (c)(1),
(2) Date: Sep. 19, 2017

(87) PCT Pub. No.: WO2016/165361
PCT Pub. Date: Oct. 20, 2016

(65) Prior Publication Data
US 2018/0068914 A1    Mar. 8, 2018

(30) Foreign Application Priority Data

Apr. 16, 2015 (CN) .......................... 2015 1 0180610

(51) Int. Cl.
*H01L 23/10* (2006.01)
*B81B 7/02* (2006.01)
(Continued)

(52) U.S. Cl.
CPC ............ *H01L 23/10* (2013.01); *B81B 7/0064* (2013.01); *B81B 7/02* (2013.01); *H01L 23/552* (2013.01);
(Continued)

(58) Field of Classification Search
CPC ... H01L 23/10; H01L 23/552; H01L 23/3192; H01L 23/5389; H01L 2924/16152;
(Continued)

(56) References Cited

U.S. PATENT DOCUMENTS 6,912,078 B2 *  6/2005  Kudrle ............... B81B 3/0062
                                                    359/224.1
7,202,552 B2 *  4/2007  Zhe ..................... B81C 1/0023
                                                    257/659
(Continued)

FOREIGN PATENT DOCUMENTS

CN    203820443 U    9/2014
CN    104779213 A    7/2015
(Continued)

OTHER PUBLICATIONS

International Searching Authority, International Search Report (ISR) and Written Opinion for International Application No. PCT/CN2015/096911, dated Feb. 3, 2016, 10 pages, State Intellectual Property of the P.R.C., China.
(Continued)

*Primary Examiner* — Nikolay Yushin
(74) *Attorney, Agent, or Firm* — Alston & Bird LLP

(57) ABSTRACT

Provided are an encapsulation structure and encapsulation method for an integrated sensor. The encapsulation structure comprises: a first substrate (1) and a first outer housing (2), the first outer housing and first substrate enclosing a first encapsulation cavity; a plurality of sensors arranged inside the first encapsulation cavity, each of the sensors comprising MEMS sensor chips (3, 8) and ASIC chips (5, 7) electrically connected to the MEMS sensor chips; inside the first encapsulation cavity, the exterior of the ASIC chip of at least one of the sensors is provided with a shielding structure. Arranging a shielding structure on the exterior of the ASIC chip in the integrated sensor and likely to be subjected to interfer-
(Continued)

ence causes the ASIC chip to be encapsulated in isolation from other sensor units, preventing the other sensor units in the integrated sensor from interfering with the ASIC chip, and effectively improving the performance of the sensor unit and the overall performance of the integrated sensor.

15 Claims, 3 Drawing Sheets

(51) Int. Cl.
 H01L 23/552 (2006.01)
 B81B 7/00 (2006.01)
(52) U.S. Cl.
 CPC ............ B81B 2201/0257 (2013.01); B81B 2201/0264 (2013.01); B81B 2207/012 (2013.01); B81C 2203/0109 (2013.01); H01L 2224/32225 (2013.01); H01L 2224/48091 (2013.01); H01L 2224/48137 (2013.01); H01L 2224/48227 (2013.01); H01L 2224/73265 (2013.01); H01L 2924/1433 (2013.01); H01L 2924/1461 (2013.01); H01L 2924/15313 (2013.01); H01L 2924/16152 (2013.01); H01L 2924/16251 (2013.01); H01L 2924/3025 (2013.01)
(58) Field of Classification Search
 CPC ....... H01L 2924/00; H01L 2924/15151; H01L 2924/1461; H01L 2224/48137; H01L 2224/48091; H01L 23/057; H01L 23/3121; H01L 23/3128; H01L 23/49811; H01L 2924/3025; H01L 2924/16251; H01L 2924/15313; H01L 2924/1433; H01L 2924/00014; H01L 2924/00012; H01L 2224/32225; H01L 2224/48227; H01L 2224/73265; B81B 7/0064; B81B 7/007; B81B 2201/0257; B81B 2201/0264; B81B 2201/0235; B81B 2201/0292; B81B 2207/012; B81B 2207/093; B81B 2207/07; B81B 2207/115; B81C 2203/0109; B81C 2203/019; B81C 2203/0792; B81C 2203/0127
 See application file for complete search history.

(56) References Cited

U.S. PATENT DOCUMENTS

| | | | |
|---|---|---|---|
| 7,294,927 B2 | 11/2007 | Takahashi | |
| 2002/0146200 A1* | 10/2002 | Kudrle | B81B 3/0062 385/18 |
| 2007/0013036 A1* | 1/2007 | Zhe | B81C 1/0023 257/659 |
| 2007/0040231 A1* | 2/2007 | Harney | B81B 7/007 257/415 |
| 2007/0164378 A1 | 7/2007 | MacGugan | |
| 2013/0028450 A1* | 1/2013 | Cortese | B81B 7/0064 381/174 |

FOREIGN PATENT DOCUMENTS

| | | |
|---|---|---|
| JP | 2007-214439 A | 8/2007 |
| JP | 2015-014543 A | 1/2015 |

OTHER PUBLICATIONS

International Searching Authority, Written Opinion (English translation) for International Application No. PCT/CN2015/096911, dated Feb. 3, 2016, 6 pages, State Intellectual Property of the P.R.C., China.

* cited by examiner

PACKAGING STRUCTURE OF INTEGRATED SENSOR

CROSS REFERENCE TO RELATED APPLICATIONS

This application is a national stage application, filed under 35 U.S.C. § 371, of International Application No. PCT/CN2015/096911, filed Dec. 10, 2015, which application claims further benefit and priority to Chinese Application No. 201510180610.9, filed Apr. 16, 2015, the contents of both of which as are hereby incorporated by reference in their entirety.

BACKGROUND

Technical Field

The present invention relates to packaging structure and method of an integrated sensor.

Description of Related Art

An integrated sensor is a sensor chip in which multiple sensor units are integrated (such as an integrated sensor integrated by a pressure sensor unit and a temperature sensor unit), and is used as a separate chip capable of simultaneously realizing multiple sensing functions. At present, the packaging of the integrated sensor is typically implemented in a manner that MEMS sensor chips and ASIC chips of all sensor units are surface-mounted on a substrate, and finally, the substrate with the MEMS sensor chips and the ASIC chips are packaged in a cavity for integration. For example, as shown in FIGS. 1 and 2, a shell 2 covers a first substrate 1 to form a large cavity in a surrounding manner, and two sensor units surface-mounted on the first substrate 1 are arranged in the cavity. One of the sensor units comprises an MEMS sensor chip 3 and an ASIC chip 5 which are electrically connected with each other via a lead 4, and the AISC chip 5 is connected to the first substrate 1 via a lead. The other sensor unit comprises an MEMS sensor chip 8 and an ASIC chip 7 which are also electrically connected with each other via a lead, and the AISC chip 7 is connected to the first substrate 1 via a lead. The shell 2 is provided with an opening 6 required by the sensor units for sensing; a bonding pad 9 is arranged on the back surface of the first substrate 1; and the sensor units are electrically connected to an external circuit via the bonding pad 9.

This existing packaging manner of the integrated sensor is implemented by packaging all sensor units thereof in the cavity. However, for some sensor units whose ASIC chips can be easily interfered, other sensor units will interfere with the ASIC chips in aspects of electricity, magnetism, heat and light, seriously affecting the performance of these sensor units and the overall performance of the integrated sensor.

BRIEF SUMMARY

One object of this invention is to provide a new technical solution for shielding certain ASIC chips in an integrated sensor to prevent the ASIC chips from being interfered by other sensor units.

According to a first aspect of the present invention, there is provided a packaging structure of an integrated sensor. The packaging structure comprises: a first substrate and a first shell which form a first package cavity in a surrounding manner, as well as a plurality of sensors arranged in the first package cavity, wherein each sensor comprises an MEMS sensor chip and an ASIC chip electrically connected to the MEMS sensor chip, and a shielding structure is arranged outside the ASIC chip of at least one sensor inside the first package cavity.

Alternatively or optionally, the shielding structure comprises an insulating adhesive wrapping an electrical connection portion of the ASIC chip and a conductive adhesive shielding cover fully covering the ASIC chip.

Alternatively or optionally, the bottom of the ASIC chip provided with the shielding structure is electrically connected to a circuit on the first substrate, and the ASIC chip is electrically connected to a corresponding MEMS sensor chip and an external circuit via the circuit on the first substrate, respectively.

Alternatively or optionally, the shielding structure comprises a second shell arranged outside the ASIC chip; and the second shell and the first substrate form a second package cavity in a surrounding manner to package the ASIC chip inside the second package cavity in an isolated manner.

Alternatively or optionally, the shielding structure is arranged outside an ASIC chip of a sensitive sensor in the plurality of sensors, or the shielding structure is arranged outside an ASIC chip of a sensor that acts as an interfering source.

Alternatively or optionally, the plurality of sensors comprises a pressure sensor, a microphone and a humidity sensor. The shielding structures are respectively arranged outside an ASIC chip of the microphone and an ASIC chip of the humidity sensor, or the shielding structure is arranged outside an ASIC chip of the pressure sensor.

Alternatively or optionally, the sensors are directly arranged on the first substrate or are arranged on the first substrate via a second substrate.

According to a second aspect of the present invention, there is provided a packaging method of an integrated sensor. The packaging method comprises the following steps: S1, providing a plurality of sensors and a substrate, each sensor comprising an MEMS sensor chip and an ASIC chip; S2, surface-mounting an ASIC chip to be shielded and a corresponding MEMS sensor chip on the substrate and completing corresponding electrical connections; S3, wrapping an electrical connection portion of the ASIC chip to be shielded with an insulating adhesive, and then fully covering the ASIC chip to be shielded with a conductive adhesive from the above; or forming a second package cavity through a second shell and the substrate in a surrounding manner to package the ASIC chip to be shielded inside the second package cavity in an isolated manner; S4, surface-mounting the other sensors on the substrate and completing corresponding electrical connections; and S5, forming a first package cavity through a first shell and the substrate to package all the sensors in the first package cavity.

Alternatively or optionally, step S4 is performed before step S2 or before step S3.

Alternatively or optionally, in step S2, the bottom of the ASIC chip to be shielded is enabled to be electrically connected to a circuit on the substrate, and the ASIC chip is electrically connected to a corresponding MEMS sensor chip and an external circuit via the circuit on the substrate, respectively.

In the present invention, the shielding structure is arranged outside an ASIC chip, which can be easily interfered, of an sensor unit in the integrated sensor, so that the ASIC chip is packaged in an isolated manner with respect to other sensor units, protecting the ASIC chip from being interfered by the other sensor units in the integrated sensor, and effectively improving the performance of this sensor unit and the overall performance of the integrated sensor.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
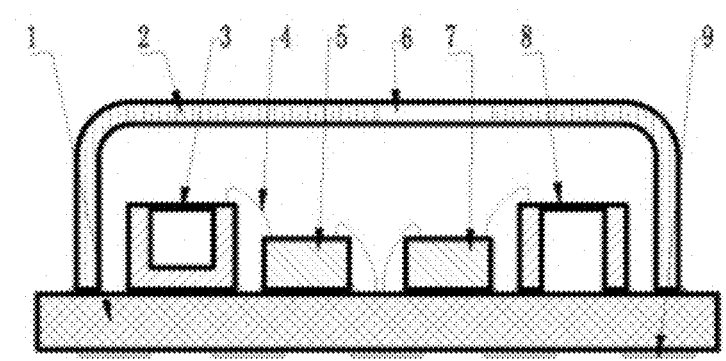
FIG. 1 and FIG. 2 are schematic diagram of a packaging structure of an existing integrated sensor.
Figure 2:
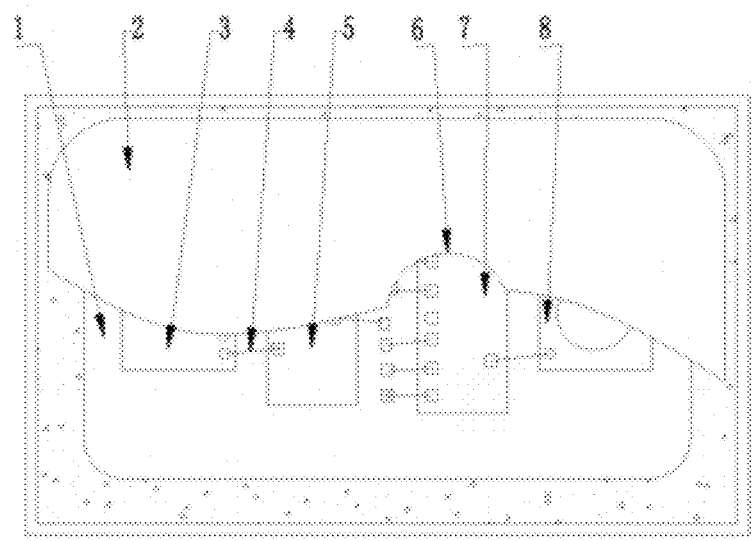

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

An integrated sensor comprises a plurality of sensor units, some of which are relatively more sensitive. That is, these sensitive sensor units that are more likely to be interfered by other sensor units in the integrated sensor are called as "sensitive sensors". In addition, sensor units that interfere with the sensitive sensors are called as "sensors that act as interfering sources". In the present invention, shielding structures may be arranged outside the ASIC chips of these sensitive sensors, or may be arranged outside the ASIC chips of the sensors that act as the interfering sources. For example, in an integrated sensor comprising a pressure sensor, a microphone and a humidity sensor, the pressure sensor releases electromagnetic signals and heat as the interfering sources; while an ASIC chip of the microphone can be easily interfered by the electromagnetic signals released from the pressure sensor, and an ASIC chip of the humidity sensor can be easily interfered by the heat released from the pressure sensor. Therefore, in the present invention, the shielding structures are respectively arranged outside the ASIC chips of the microphone and the humidity sensor. Optionally, in another embodiment, the shielding structure may be arranged outside the ASIC chip of the pressure sensor that serves as the interfering source, so that a technical effect of shielding interference caused by the pressure sensor on the other sensors is realized. On the basis of the present invention, those skilled in the art can determine other sensitive ASIC chips that are required to be shielded based on an application product and an environment, which should also be within the protective scope of the present invention.

Figure 3:
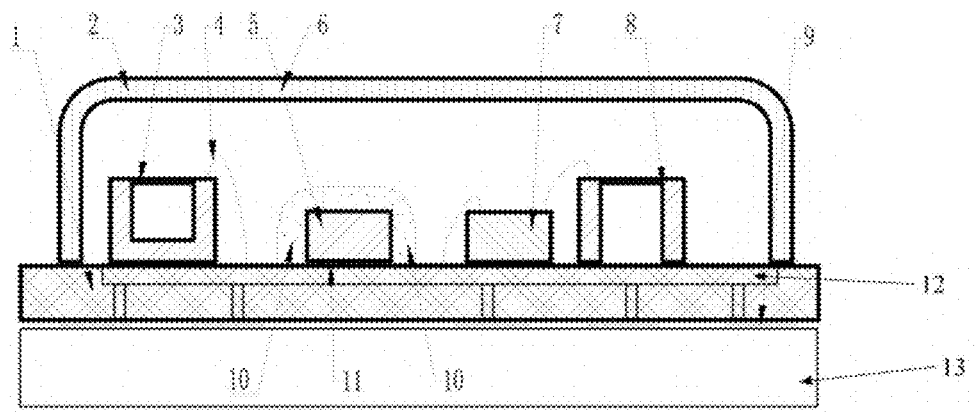
FIG. 3 and FIG. 4 are schematic diagram of a packaging structure of an integrated sensor according to a first embodiment of the present invention.
Figure 4:
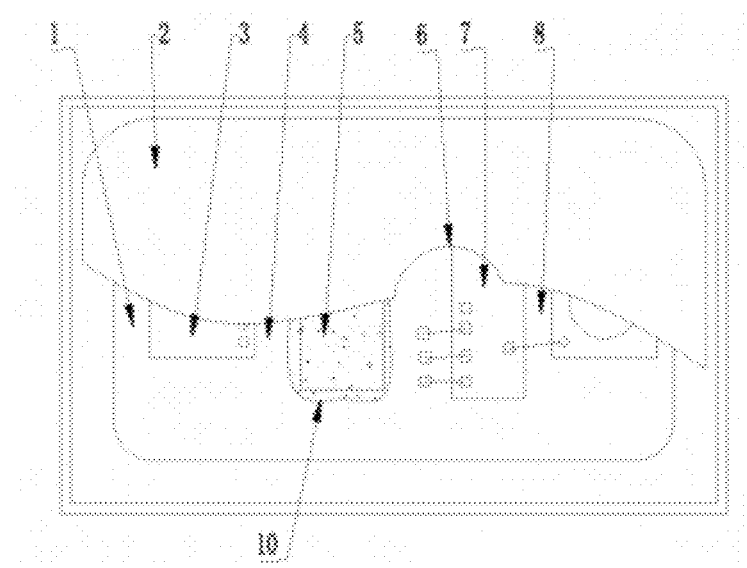

FIG. 3 and FIG. 4 respectively show a packaging structure of an integrated sensor according to a first embodiment. Referring to FIG. 3 and FIG. 4, the packaging structure comprises a first substrate 1, a first shell 2 and two sensor units, wherein the first shell 2 and the first substrate 1 form a first package cavity in a surrounding manner, and the two sensor units are arranged in the first package cavity. The second sensor unit comprises an MEMS sensor chip 8 and an ASIC chip 7 that are electrically connected with each other via a lead, and the AISC chip 7 is likewise connected to the first substrate 1 via a lead. The first sensor unit comprises an MEMS sensor chip 3 and an ASIC chip 5. The bottom of the AISC chip 5 is electrically connected to a circuit 12 on the first substrate 1 through welding, metal wire bonding or the like. Likewise, the MEMS sensor chip 3 is connected to the circuit 12 on the first substrate 1 via a lead 4, so that the ASIC chip 5 can be electrically connected to the corresponding MEMS sensor chip 3 and an external circuit 13 through the circuit 12 on the first substrate 1, respectively, facilitating subsequent shielding processing on the ASIC chip 5. In the first embodiment, the shielding of the ASIC chip 5 is implemented via an insulating adhesive 11 and a conductive adhesive shielding cover 10. In the implementation, first, the insulating adhesive 11 is injected to the bottom of the ASIC chip 5 to wrap an electrical connection portion of the ASIC chip 5, and then, a conductive adhesive is injected from the above to fully cover the ASIC chip 5 to form the conductive adhesive shielding cover 10 for shielding the ASIC chip 5. The first shell 2 is provided with an opening 6 required by the sensor units for sensing. A bonding pad 9 is arranged on the back surface of the first substrate 1, and the two sensor units are electrically connected to the external circuit via the bonding pad 9.

Figure 5:
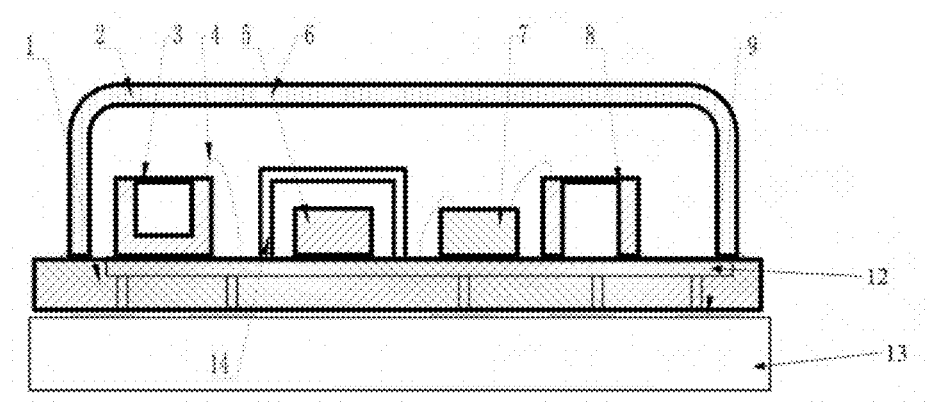
FIG. 5 is a schematic diagram of a packaging structure of the integrated sensor according to a second embodiment of the present invention.

FIG. 5 shows a packaging structure of the integrated sensor according to a second embodiment, which differs from the first embodiment shown in FIG. 3 in that the shielding of the ASIC chip 5 is implemented via a second shell 14. The second shell 14 and the first substrate 1 form a second package cavity in a surrounding manner to package the ASIC chip 5 inside the second package cavity in an isolated manner.

Figure 6:
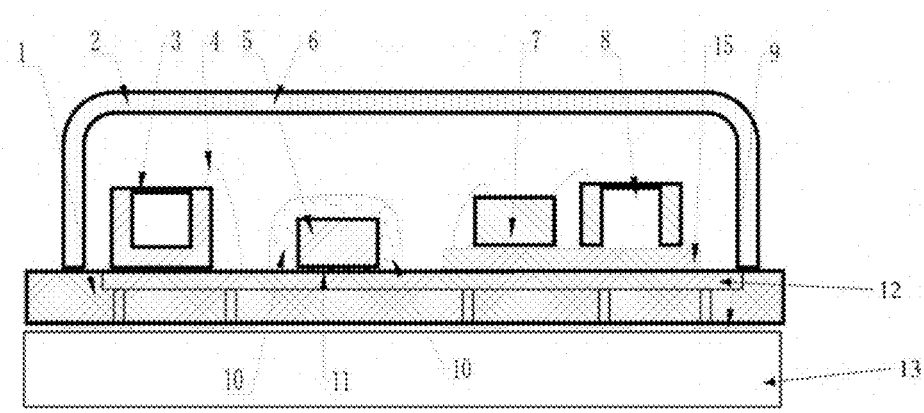
FIG. 6 is a schematic diagram of a packaging structure of the integrated sensor according to a third embodiment of the present invention.

FIG. 6 shows a packaging structure of the integrated sensor according to a third embodiment, which differs from the first embodiment shown in FIG. 3 in that the second sensor unit is arranged on the first substrate 1 indirectly via a second substrate 15 rather than is directly arranged on the first substrate 1. The second sensor unit is surface-mounted on the second substrate 15, and is connected to the external circuit via the bonding pad 9 on the back surface of the first substrate 1. During assembling and operation processes of the sensor unit, external stress is transferred to the first substrate 1, and is then buffered and absorbed by the second substrate 15, thereby protecting the sensor unit and enabling the performance of the sensor unit to be more stable. In particular, for a pressure sensor unit, the second substrate 15 is designed as a buffering part, so that a data error of the pressure sensor caused by the external stress is avoided, improving the sensitivity of the pressure sensor unit.

The first shell 2 and the second shell 14 may be metal shells or shells formed by substrates.

In the above embodiments, as each chip needs to be separately surface-mounted and electrically connected, there are numerous procedures, the efficiency is low, and a number of hidden troubles is greatly increased. Moreover, an assembling safety space is required to be left between every two chips, so that the overall space of a product is wasted. In order to separate the cavities better, the sensor units may also be designed in an integrated manner in the present invention to reduce space waste, optimize the processing procedures, and improve the package efficiency and a product yield. The present invention provides three integration manners: 1, an MEMS sensor chip and an ASIC chip of a sensor unit are integrated together; 2, ASIC chips of sensor units that will not interfere with each other are integrated together; and 3, MEMS sensor chips of the sensor units that will not interfere with each other are integrated together.

Figure 7:
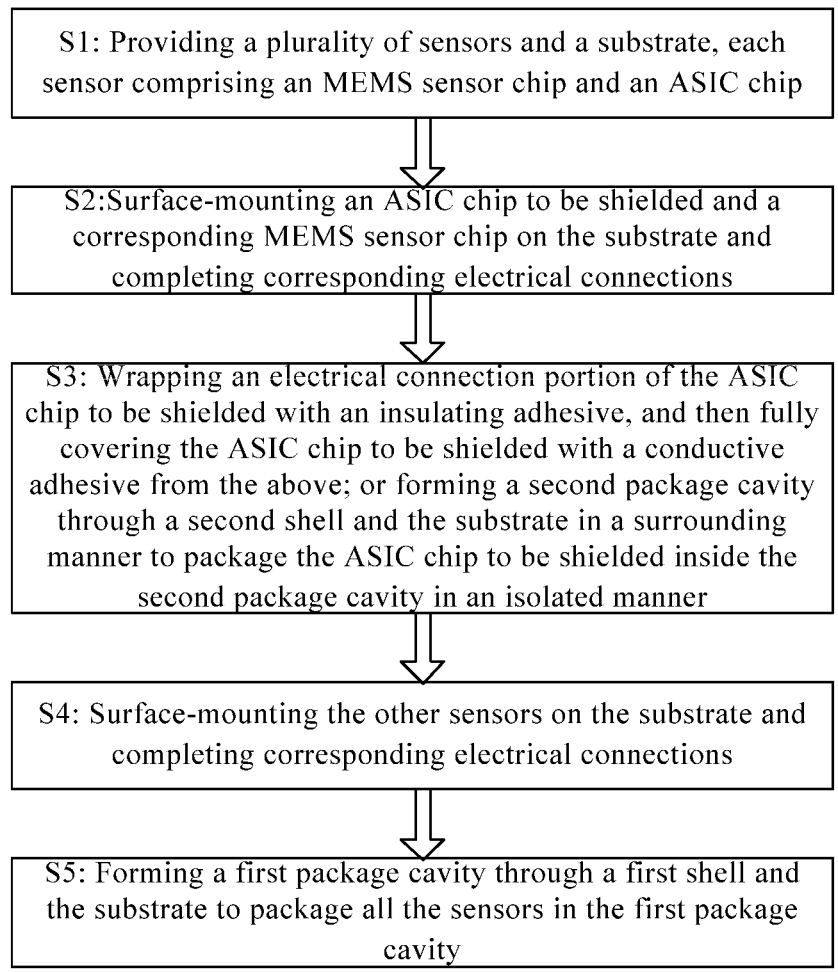
FIG. 7 shows a flow chart of a packaging method of an integrated sensor provided of the present invention.

FIG. 7 shows a flow chart of a packaging method of an integrated sensor provided by the present invention. The packaging method comprises the following steps: S1, providing a plurality of sensors and a substrate, each sensor comprising an MEMS sensor chip and an ASIC chip; S2, surface-mounting an ASIC chip to be shielded and a corresponding MEMS sensor chip on the substrate and completing corresponding electrical connections; S3, wrapping an electrical connection portion of the ASIC chip to be shielded with an insulating adhesive, and then fully covering the ASIC chip to be shielded with a conductive adhesive from the above; or forming a second package cavity through a second shell and the substrate in a surrounding manner to package the ASIC chip to be shielded inside the second package cavity in an isolated manner; S4, surface-mounting the other sensors on the substrate and completing corresponding electrical connections; and S5, forming a first package cavity through a first shell and the substrate to package all the sensors in the first package cavity.

Step S4 may be performed before step S2 or before step S3.

In step S2, the bottom of the ASIC chip to be shielded is enabled to be electrically connected to a circuit on the substrate, and the ASIC chip is electrically connected to a corresponding MEMS sensor chip and an external circuit via the circuit on the substrate, respectively.

The sensors may be directly arranged on the first substrate or may be arranged on the first substrate via a second substrate.

The first shell and the second shell may be metal shells or shells formed by substrates.

In the present invention, the shielding structure is arranged outside an ASIC chip, which can be easily interfered, of an sensor unit in the integrated sensor, so that the ASIC chip is packaged in an isolated manner with respect to other sensor units, protecting the ASIC chip from being interfered by the other sensor units in the integrated sensor, and effectively improving the performance of this sensor unit and the overall performance of the integrated sensor. In particular, the shielding cover for shielding the ASIC chip may be formed by the conductive adhesive, so that the process is easy to implement and the shielding effect is excellent.

Although some specific embodiments of the present invention have been demonstrated in detail with examples, it should be understood by a person skilled in the art that the above examples are only intended to be illustrative but not to limit the scope of the present invention.

What is claimed is:

1. A packaging structure of an integrated sensor, the packaging structure comprising:
 a first substrate,
 a first shell, the first shell and the first substrate defining a first package cavity in a surrounding manner, and
 a plurality of sensors arranged in the first package cavity, wherein:
  each sensor comprises an MEMS sensor chip and an ASIC chip electrically connected to the MEMS sensor chip,
  a shielding structure is arranged outside the ASIC chip of at least one sensor and is arranged inside the first package cavity to shield the ASIC chip, and
  the shielding structure comprises an insulating adhesive wrapping an electrical connection portion of the ASIC chip and a conductive adhesive shielding cover fully covering the ASIC chip.

2. The structure of claim 1, wherein:
 a bottom of the ASIC chip, outside which the shielding structure is arranged, is electrically connected to a circuit on the first substrate, and
 the ASIC chip is electrically connected to a corresponding MEMS sensor chip and an external circuit via the circuit on the first substrate, respectively.

3. The structure of claim 1, wherein the shielding structure is arranged outside an ASIC chip of a sensitive sensor in the plurality of sensors.

4. The structure of claim 1, wherein the shielding structure is arranged outside an ASIC chip of a sensor that acts as an interfering source.

5. The structure of claim 1, wherein at least one of:
 the plurality of sensors comprise a pressure sensor, a microphone and a humidity sensor;
 the shielding structures are respectively arranged outside ASIC chips of the microphone and the humidity sensor; or
 the shielding structure is arranged outside an ASIC chip of the pressure sensor.

6. The structure of claim 1, wherein the sensors are directly arranged on the first substrate.

7. A packaging structure of an integrated sensor, the packaging structure comprising:
 a first substrate,
 a first shell, the first shell and the first substrate defining a first package cavity in a surrounding manner, and
 a plurality of sensors arranged in the first package cavity, wherein:
  each sensor comprises an MEMS sensor chip and an ASIC chip electrically connected to the MEMS sensor chip,
  a shielding structure is arranged outside the ASIC chip of at least one sensor and is arranged inside the first package cavity to shield the ASIC chip,
  a bottom of the ASIC chip, outside which the shielding structure is arranged, is electrically connected to a circuit on the first substrate, and
  the ASIC chip is electrically connected to a corresponding MEMS sensor chip and an external circuit via the circuit on the first substrate, respectively.

8. The structure of claim 7, wherein the shielding structure is arranged outside an ASIC chip of a sensitive sensor in the plurality of sensors.

9. The structure of claim 7, wherein the shielding structure is arranged outside an ASIC chip of a sensor that acts as an interfering source.

10. The structure of claim 7, wherein at least one of:
the plurality of sensors comprise a pressure sensor, a microphone and a humidity sensor;
the shielding structures are respectively arranged outside ASIC chips of the microphone and the humidity sensor; or
the shielding structure is arranged outside an ASIC chip of the pressure sensor.

11. The structure of claim 7, wherein the sensors are directly arranged on the first substrate.

12. A packaging structure of an integrated sensor, the packaging structure comprising:
a first substrate,
a first shell, the first shell and the first substrate defining a first package cavity in a surrounding manner, and
a plurality of sensors arranged in the first package cavity, wherein:
each sensor comprises an MEMS sensor chip and an ASIC chip electrically connected to the MEMS sensor chip, and
a shielding structure is arranged outside the ASIC chip of at least one sensor and is arranged inside the first package cavity to shield the ASIC chip, and
at least one of:
the plurality of sensors comprise a pressure sensor, a microphone and a humidity sensor;
the shielding structures are respectively arranged outside ASIC chips of the microphone and the humidity sensor; or
the shielding structure is arranged outside an ASIC chip of the pressure sensor.

13. The structure of claim 12, wherein the shielding structure is arranged outside an ASIC chip of a sensitive sensor in the plurality of sensors.

14. The structure of claim 12, wherein the shielding structure is arranged outside an ASIC chip of a sensor that acts as an interfering source.

15. The structure of claim 12, wherein the sensors are directly arranged on the first substrate.

\* \* \* \* \*